United States Patent
Garrn

(10) Patent No.: US 10,974,360 B2
(45) Date of Patent: Apr. 13, 2021

(54) USE OF A DIAMOND LAYER DOPED WITH FOREIGN ATOMS TO DETECT THE DEGREE OF WEAR OF AN UNDOPED DIAMOND FUNCTION LAYER OF A TOOL

(71) Applicant: GUEHRING KG, Albstadt (DE)

(72) Inventor: Immo Garrn, Ertingen (DE)

(73) Assignee: Guehring KG, Albstadt (DE)

(*) Notice: Subject to any disclaimer, the term of this patent is extended or adjusted under 35 U.S.C. 154(b) by 0 days.

(21) Appl. No.: 16/568,883

(22) Filed: Sep. 12, 2019

(65) Prior Publication Data

US 2020/0094364 A1 Mar. 26, 2020

Related U.S. Application Data

(63) Continuation of application No. PCT/EP2018/056010, filed on Mar. 12, 2018.

(30) Foreign Application Priority Data

Mar. 13, 2017 (DE) .................... 10 2017 204 109.9

(51) Int. Cl.
*G08B 21/00* (2006.01)
*B23Q 17/09* (2006.01)
(Continued)

(52) U.S. Cl.
CPC ..... *B23Q 17/0995* (2013.01); *B23Q 17/0952* (2013.01); *C23C 16/278* (2013.01); *C23C 16/486* (2013.01)

(58) Field of Classification Search
None
See application file for complete search history.

(56) References Cited

U.S. PATENT DOCUMENTS 5,571,616 A 11/1996 Phillips et al.
5,874,775 A * 2/1999 Shiomi ............... H01L 23/3732
257/706
(Continued)

FOREIGN PATENT DOCUMENTS

DE 44 19 393 A1 12/1995
DE 197 51 708 A1 5/1998
(Continued)

OTHER PUBLICATIONS

International Search Report and Written Opinion of the International Searching Authority (and translation obtained from WIPO) from a corresponding international patent application (PCT/EP2018/056010) dated Jun. 18, 2018, 19 pages.
(Continued)

*Primary Examiner* — Julie B Lieu
(74) *Attorney, Agent, or Firm* — Burr & Brown, PLLC

(57) ABSTRACT

A first diamond layer made of polycrystalline diamonds and doped with foreign atoms, is arranged on a metal surface of a machining tool, and is used to detect the degree of wear of an undoped polycrystalline second diamond layer, which is arranged on the doped diamond layer and forms a functional region of the machining tool, wherein at least one physical parameter is detected continuously or periodically during operation of the tool, and wherein a change in the parameter indicates the degree of wear of the undoped second diamond layer. The doped diamond layer forms an "intelligent stop layer" for the tool because as a result of change in the transition from the undoped to the doped layer, the conductivity of the system changes, for example, and this change can be used to form a stop signal for the machine drive before the tool and the machined workpiece are damaged.

29 Claims, 1 Drawing Sheet

(51) Int. Cl.
*C23C 16/27* (2006.01)
*C23C 16/48* (2006.01)

(56) References Cited

U.S. PATENT DOCUMENTS

| | | | |
|---|---|---|---|
| 6,082,200 A * | 7/2000 | Aslam | G01L 1/18 73/774 |
| 2017/0011914 A1 | 1/2017 | Sumant et al. | |
| 2017/0145563 A1 | 5/2017 | Sattel et al. | |
| 2017/0200850 A1* | 7/2017 | Lee | H01L 31/02244 |
| 2019/0118150 A1* | 4/2019 | Schoofs | C30B 33/02 |

FOREIGN PATENT DOCUMENTS

| | | |
|---|---|---|
| DE | 102 53 178 A1 | 3/2004 |
| DE | 10 2004 019 742 A1 | 11/2005 |
| DE | 10 2014 210 371 A1 | 12/2015 |
| EP | 0 596 619 A1 | 5/1994 |
| EP | 2 230 327 A1 | 9/2010 |
| JP | 2007-262514 A | 10/2007 |

OTHER PUBLICATIONS

DPMAregister from a corresponding German patent application (DE 10 2017 204 109.9) printed on Oct. 3, 2019, 2 pages.

* cited by examiner

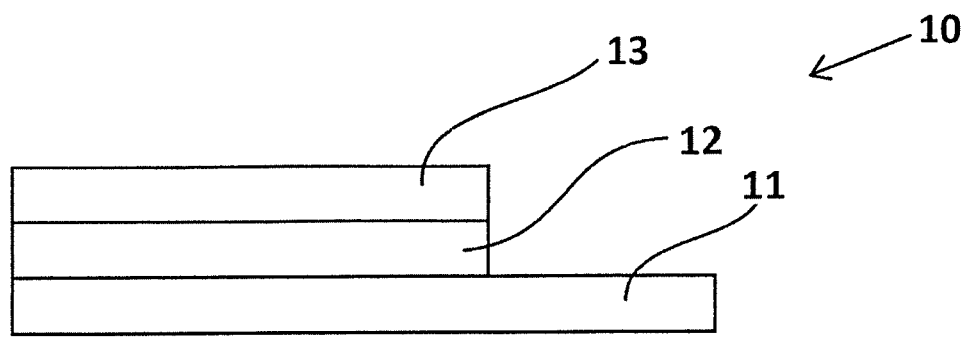

USE OF A DIAMOND LAYER DOPED WITH FOREIGN ATOMS TO DETECT THE DEGREE OF WEAR OF AN UNDOPED DIAMOND FUNCTION LAYER OF A TOOL

The present invention relates to the use of a first diamond layer, which is doped with foreign atoms and which is made of polycrystalline diamonds and which is arranged on a metal surface of a machining tool, to detect the degree of wear of an undoped polycrystalline second diamond layer, which is arranged on the doped diamond layer, according to claim 1, as well as a method for continuously detecting the degree of wear of an undoped diamond layer, which forms a functional region of a machining tool, according to claim 14.

Tools for machining comprising a tool head, a tool shank, and comprising a clamping section for accommodation in a tool accommodation are known in the most diverse form from the prior art.

In their cutting region, such tools have functional regions, which are adapted to the specific requirements of the materials to be machined.

The mentioned tools are in particular those, which are embodied as drilling, milling, countersinking, turning, threading, contouring or reaming tools, which can have cutting bodies or guide strips as functional region, wherein the cutting bodies can be embodied, for example, as replaceable or indexable inserts, and the guide strips can be embodied, for example, as support strips.

Such tool heads typically have functional regions, which provide the tool with a high wear resistance in response to the machining of highly abrasive materials, such as, Si-alloyed aluminum, for example AlSi9Cu4Mg [AlSi9], AlSi17Cu4Mg [AlSi17] or AlMg1SiCu+20% of SiC [Al-MMC] as well as glass- and carbon fiber-reinforced plastics.

DE 20 2005 021 817 U1 by the present applicant describes tool heads, which consist of a hard material comprising at least one functional layer, which comprise a superhard material, such as cubic boron nitride (CBN) or polycrystalline diamond (PCD).

Long service lives and large reaches of the tools can be attained at high cutting speeds with regard to mechanical or thermal demands, respectively, for drilling, milling or reaming, respectively.

Methods for applying a polycrystalline diamond layer to non-diamond substrates have also been known for a long time. For example U.S. Pat. No. 5,082,359 thus describes the application of a polycrystalline diamond layer by means of chemical vapor deposition (CVD) on metallic substrates.

In U.S. Pat. No. 5,082,359, typical materials, which are used in the semiconductor industry, such as germanium, silicon, gallium arsenide as well as polished wafers of monocrystalline silicon, are mentioned as CVD substrates, and titanium, molybdenum, nickel, copper, tungsten, tantalum, steel, ceramic, silicon carbide, silicon nitride, silicon aluminum oxynitride, boron nitride, aluminum oxide, zinc sulfide, zinc selenide, tungsten carbide, graphite, quartz glass, glass and sapphire are mentioned as further useful substrates.

According to U.S. Pat. No. 5,082,359, the CVD is furthermore performed by reaction of methane and hydrogen in the vacuum on a hot tungsten wire, in order to deposit the carbon created in the high vacuum on the substrate surface.

It is further known for tools to provide functional surfaces with a diamond layer, wherein a CVD method is likewise used for the diamond coating.

Such a diamond coating method is described, for example, in WO 98/35071 A1. In particular the deposition of a polycrystalline diamond layer on a hard metal substrate of a tungsten carbide embedded into a cobalt matrix is described in WO 2004/031437 A1.

A hard metal typically contains sintering materials made of hard material particles and binding material, for example tungsten carbide grains, wherein the tungsten carbide grains form the hard materials, and the cobalt-containing binding matrix serves as binding agent for the WC grains and provides the layer with the toughness required for the tool.

By nature, diamond-coated hard metal or cermet tools, respectively, have a positive effect on the wear protection of the tool as well as on the service life thereof in continuous operation.

The good adhesion of the diamond coating on such a hard metal substrate, however, is always problematic, which is why different pretreatment methods are required in the prior art, all of which aim at removing cobalt from the binding matrix for the hard material particles, e.g. WC, because analyses have shown that cobalt can interfere with the diamond deposition due to different influences, in particular by a type of catalytic graphite conversion tendency.

It is further described in DE 10 2006 026 253 A1 that the cobalt binder of the substrate is removed from the surface, because harmful interactions between the carbon, which is to form the diamond layer, and the cobalt, take place during the long process time and high temperatures in response to the CVD diamond coating, wherein cobalt prevents the diamond formation and instead leads to graphitic phases.

This effect of the cobalt-containing binding agent layer on the CVD diamond coating is also described in the more recent literature, for example in the review article by HAUBNER, R. and KALSS, W. (2010): Int. Journal of Refractory Metals & Hard Materials 28, 475-483: "Diamond deposition on hardmetal substrates—Comparison of substrate per-treatments and industrial applications".

According to the statements by HAUBNER et al., carbon can diffuse from the CVD diamond coating into the cobalt-containing binding matrix, wherein cobalt droplets form simultaneously during the diamond deposition from the gas phase, which severely interfere with the substrate structure and wherein a certain brittleness is created. According to HAUBNER et al., it has furthermore been recognized that cobalt is a catalyst for diamond growth and is the more or less spontaneous conversion thereof into graphite.

This is why it is clear that attempts were made in the prior art for empirical reasons to remove cobalt from the binding matrix to reduce the impact of cobalt on the diamond deposition.

All methods of the prior art have in common, however, that even though a removal of cobalt from the binding matrix leads to a relative good adhesion of the CVD diamond coating, the binding matrix, which is depleted of cobalt, is seriously disrupted for the hard material particles, in particular WC, and the embedding of the WC grains as hard material particles is no longer the case. The integrity and mechanical strength of the substrate surface in particular in response to the high stresses as tool cannot be ensured any longer. This is why structural defects occur in the substrate/diamond interphase, so that the diamond layer can ultimately detach with parts of the substrate structure, so that tools coated in this way become unusable.

This is where the teaching of DE 10 2014 210 371 A1 by the applicant of the present invention starts, which relates to a machining tool comprising at least one diamond-coated functional region comprising a substrate surface made of a hard metal or a ceramic material located below the diamond layer, wherein the surface contains hard material particles on the basis of carbide and/or nitride and/or oxide, which are embedded into a cobalt-containing binding matrix, wherein the diamond layer is arranged directly on the substrate surface without having removed a significant amount of cobalt from the binding matrix of the substrate surface by means of chemical or physical methods. According to the teaching of DE 10 2014 210 371 A1, such a tool can be produced directly on the ion beam-pretreated cobalt-containing substrate surface by pretreatment of a hard metal substrate surface with a positively charged ion beam and a following conventional CVD diamond coating. The atoms, on which the ions are based, thereby remain essentially in the substrate. The tools obtained in the prior art have a good diamond layer adhesion on the substrate as well as high wear resistances.

In light of the foregoing, it should be noted that tools, which are coated with polycrystalline diamonds and in particular tools, which are diamond CVD-coated, have meanwhile firmly established themselves in many industrial sectors for the machining of highly abrasive materials, such as the above-mentioned Si-alloyed aluminum alloys as well as carbon fiber-reinforced and glass fiber-reinforced polymers and the like [see Fiona Sammler, dissertation TU Berlin: reports from the Center for Production Technology Berlin, "Increase of the utilization potentials of CVD diamond-coated tools", Fraunhofer-Verlag, Stuttgart, 2015].

According to the above-mentioned dissertation, the deposition of a CVD diamond layer on a tool surface as substrate typically takes place at a coating pressure of between 1 kPA and 100 hPa and coating temperature of between 800° C. and 1100° C. in a carbon-containing atmosphere with high hydrogen concentration. The gas phase is thereby activated by means of plasma or thermally. The starting materials for the coating are present in gaseous form, for example in the form of methane ($CH_4$) and/or acetylene ($C_2H_2$) and/or carbon dioxide ($CO_2$) in mixture with hydrogen ($H_2$). According to Sammler 2015, two parallel chemical processes are required to produce diamond by means of low-pressure synthesis. A hydrocarbon (or also $CO_2$) is split pyrolytically and reacts selectively with all carbon compounds, except with the diamond modification of the carbon under the reaction conditions of hydrogen, which is present in atomic form, and thus suppresses a graphite formation.

According to Sammler 2015, a differentiation can be made between CVD thick film and CVD thin film, depending on the desired use. CVD methods with high deposition rates are used predominantly for an efficient production of CVD thick films, in order to deposit layer thicknesses of up to 2 mm. After the deposition, they are separated from their substrate, are brought into any shapes by means of laser cutting methods, and are soldered or adhered to tools as cutting inserts.

While the use of PCD and CVD thick film tools is rather limited to geometrically simple shapes, such as, e.g. cutting inserts, the deposition of thin diamond layers directly onto a substrate body by means of CVD provides the opportunity to directly coat geometrically complex tools. Tools, such as, e.g., drills, threading tools, and shank cutters, as well as cutting and micro tools, as well as tool comprising large diameters can thus also be coated. In the case of CVD thin films, the layer thickness lies in the range of between 1 μm and 500 μm, often between 1 μm and 40 μm.

According to Sammler 2015, the most common methods for the diamond coating are the hot wire method [hot filament CVD or HF CVD], the microwave plasma method [microwave plasma CVD, MWP CVD] and the plasma jet method. The methods differ by the amount of the activated species and thus by coating speed and layer quality, coatable surface and geometry, as well as scalability. For example as compared to the plasma method, in particular the HF CVD method provides the largest flexibility at lower coating temperatures and is thus often used industrially for the direct diamond coating of tool surfaces. The wires—as already mentioned above, they can be W-wires—can be adapted to the different geometries of the tools to be coated, because a certain distance to the hot wires has to be maintained for the layer structure, which typically lies in the range of between approx. 5 mm and 30 mm. The substrates are thus heated evenly to temperatures of between 500° C. and 1100° C. It is thus possible to also coat undercuttings and rear sides. The coating rates in the case of the HF CVD method typically lie between 0.1 μm/h and 3 μm/h (see Sammler 2015).

Due to the fact, however, that very hard materials—such as the diamond cutting materials mentioned by the present invention—are also subject to a more or less strong wear in response to corresponding industrial use, the problem presents itself more and more at high operating speeds and long service lives of the diamond-coated tools that the diamond cutting materials wear after a certain time such that the diamond-coated tool gets stuck in the workpiece, which has just been machined, which leads to the destruction of the tool by breakage and usually also to the destruction of the machined workpiece, and in the worst case also damages the machine, which drives the tool.

In the field of the diamond-coated machining tools, there is thus a need for an early detection of the above-described problems and in particular of the wear of a diamond layer in a functional region of a tool, continuously during the tool operation, and to take counter measures, which prevent damages to the tool, to the machined workpiece, and to the device driving the tool.

Due to the fact that, in the case of hard metal tools, a diamond coating has thus proven itself for some time in the prior art in order to increase the wear-resistance in particular in response to the machining of highly abrasive materials, and the technologies are available for the diamond coating, it is thus the object of the present invention to provide machining tools as well as a method for the production thereof, wherein it is made possible to continuously detect the degree of wear of the diamond coating of the functional region of a tool during operation, in order to stop the tool at an early stage, in order to prevent a destruction thereof and/or of the workpiece, which is being machined at the time.

This object is solved by means of a use comprising the features of patent claim 1.

From a procedural aspect, the above object is solved by means of a method comprising the features of patent claim 14.

The present invention relates in particular to a use of a first diamond layer, which is doped with foreign atoms and which is made of polycrystalline diamond, and which is arranged on a metal surface of a machining tool, to detect the degree of wear of an undoped polycrystalline second diamond layer, which is arranged on the doped diamond layer and which forms a functional region of the machining tool, wherein at least one physical parameter is detected continuously or periodically during the operation of the tool, and wherein a change of the parameter indicates the degree of wear of the undoped second diamond layer.

The present invention further relates to a method for continuously detecting the degree of wear of an undoped diamond layer, which forms a functional region of a machining tool, and which is arranged on a diamond layer doped with foreign atoms, during operation of the tool; wherein the doped diamond layer is arranged directly on the substrate surface of the machining tool;

at least one measurement parameter, which results from both diamond layers, the tool, and a workpiece machined with the tool, is detected continuously or periodically during the operation of the tool;

a predefined threshold value for the measurement parameter is specified; and wherein a change of the measurement parameter above or below the predefined threshold value indicates the degree of wear of the undoped diamond layer.

FIG. 1 schematically depicts a section of an embodiment of a machining tool in accordance with the present invention.

The invention is based on the fact that diamond layers doped with foreign atoms—with more or less the same hardness—have other physical properties than undoped diamond layers. For example the electrical conductivity of doped diamonds is thus significantly higher at a given temperature than the electrical conductivity of undoped diamonds, depending on the doping type, i.e. with which foreign atoms doping was performed and/or whether an n-type or p-type doping is present. Said undoped diamonds act quasi as insulator and do not have a significant electrical conductivity.

If, in the simplest case, continuously and periodically measuring the electrical resistance or the electrical conductivity of an overall system comprising a metallic workpiece as well as the tool with the layer sequence:

metallic substrate layer—doped diamond layer—undoped diamond layer during operation, no significant electrical conductivity will be measurable when using an unused diamond-coated tool, or the Ohmic resistance will assume the values of an insulator and will go to infinity, respectively, because even though the undoped diamond layer of the functional region of the tool is in mechanical contact with the metallic workpiece, it does not form an electrical contact to the metallic workpiece due to the insulating property of the undoped diamond layer.

However, if the undoped diamond layer, which forms the functional region of the tool, is worn or partially flakes off during the operation, more and more doped diamond material will gradually come into contact with the metallic workpiece, which leads to a change of the electrical conductivity of the system and to a change of the Ohmic resistance of the system due to the conductive or at least semi-conductive property of the doped diamond material of the doped layer. This change can be detected and evaluated with the help of a suitable control device, which is well-known to the person of skill in the art. As soon as a predetermined threshold value—which is to be determined in the usual way by means of calibration—is exceeded or fallen below, the control device sends a stop command to the drive of the tool, so that the latter comes to a standstill. These measures make it possible that the tool can be replaced before tool, workpiece and/or the tool-guiding machine are damaged.

It goes without saying that, when necessary, the cutting speed of the machining tool can initially be reduced in a first step, in order to be able to still conclude the operating process, for example, before the machine is then finally stopped and the tool has to be exchanged.

In addition to the differences in the electrical properties between doped and undoped diamond layer, which have been described in an exemplary manner, the invention thus also utilizes the fact that both diamond layers have comparable hardnesses, so that operation can nonetheless be continued with the tool with the doped diamond layer in the case of wear of the typically thicker undoped diamond layer up to a certain degree, because the tools coated according to the invention have "emergency operation properties" after wear of the actual functional layer made of undoped diamonds, similar to those of modern vehicle tires, when the tire is damaged and can nonetheless still be driven across a certain distance.

In summary, it can be said that the doping of diamond turns the diamond, which is not electrically conductive, into a semiconductor, which conducts electricity better by several orders of magnitude.

A particular advantage results, when at least the undoped diamond layer was created by means of a CVD method. Depending on the state of the coating after wear and tear of the undoped diamond layer of the functional region of the tool, the tool can be coated with diamond again, typically after cleaning, e.g. by means of sandblasting and/or plasma cleaning in a CVD chamber, so that a new (basic) tool does not need to be produced, which pays off in particular in the case of complex and costly tools.

For the purposes of the present invention, the term "doping" is understood as the systematic introduction of impurities in the form of foreign atoms into a diamond-crystal lattice. The amount of foreign atoms (dopant) introduced by means of doping is thereby relatively small as compared to the diamond material. The foreign atoms form so-called imperfections in the crystal lattice and can thus systematically change the properties of the starting material.

The doping of diamonds with foreign atoms—thus non-carbon atoms—is generally well-known to the person of skill in the art. An overview of the theoretical foundations and practical options of the diamond doping by means of ion beams and CVD method can be found in the dissertation by Thomas Vogel, Ruhr-Universitat Bochum (2005), physics and astronomy department, with the topic "Doping of diamond by means of MeV ion implantation", to which reference is hereby made in its entirety.

DE 691 17 140 T2 furthermore describes polycrystalline machining diamond tools and a method for the production thereof, in the case of which diamond coatings, which are doped with foreign atoms, are used as well. These are tools, which have polycrystalline diamonds in the form of a cutting tip, which are typically soldered onto a surface of the tool body.

According to DE 691 17 140 T2, the small diamond plates are produced by means of a CVD coating, wherein a carbon-containing gas, hydrogen gas and optionally a doping gas are introduced as material gas into a vacuum chamber, the material gas is excited into a state, in which plasma or radicals form, the material gas is guided onto a heated substrate, wherein diamond is deposited on the substrate, wherein initially no dopant is used, and the dopant concentration is then gradually increased.

Following the CVD method, the substrate is etched away, so that a small polycrystalline diamond plate remains. The (former) substrate side of the small diamond plate, which is undoped or weakly doped, is then arranged on the tool body in such a way that it comes to rest on the machining side of the tool, wherein the doped diamond layer is located directly on the tool body as fixing side. The fixing side of the small diamond plate produced by means of CVD diamond coating is typically metallized and is secured to the tool body as cutting plate by means of soldering. According to DE 691 17 140 T2, the thickness of the obtained small diamond plates is up to 1000 μm.

In summary, DE 691 17 140 T2 thus describes diamond tools, which have a diamond insert and which have a gradient of the dopant concentration in their diamond layer, wherein the gradient can have a dopant concentration of 0% dopant on the chip side up to a maximum value on the tool-side surface.

In contrast to the purpose of the present invention, namely the detection when an undoped diamond layer is worn to the extent that the tool can be replaced without damages to tool, workpiece and drive device, the doping according to DE 691 17 140 T2 is to have the following further advantages:

The diamond on or in the vicinity of the chip surface is synthesized as a diamond of better quality with lower or no dopant concentration. The diamond on or in the vicinity of the fixing surface of the small cutting plate is composed as a diamond of inferior quality with higher dopant concentration. Due to this higher dopant concentration, the diamond has a lower rigidity and sufficient elasticity in the vicinity of the fixing surface, which is important, because a sufficient elasticity and low rigidity can eliminate strong tensions, which an object, which is to be cut, applies onto the chip surface. According to DE 691 17 140 T2, the doped diamond layer on the fixing surface of the small diamond plate plays a role as tension eliminating layer or as impact absorption layer.

As carbon source for the CVD method therein, document DE 691 17 140 T2 discloses methane, ethane, acetylene, ethanol, methanol, and acetone, among others, in the presence of hydrogen gas.

According to DE 691 17 140 T2, Si, B, Al, W, Mb, Co, Fe, Nb, Ta as well as their carbides, oxides and nitrides, halogens, P and N can be considered, for example, as dopants, which are used as gaseous dopant compounds.

For example according to DE 691 17 140 T2, a doping with boron can be performed in a simple manner by means of supplying $B_2H_6$ to the material gas of methane and hydrogen.

The diamond coating method according to DE 691 17 140 T2 is performed as hot wire CVD method at a pressure of between 10 kPa and 17 kPa and a substrate temperature of between 250° C. and 950° C., and a wire of W, Ta or Re. The dopant concentrations in the finished end product are up to 9%.

With regard to the performance of a diamond coating CVD method with and without dopants, reference is hereby made to the teaching of DE 691 17 140 T2 in its entirety.

It goes without saying that thermodynamic conditions disclosed in the prior art of the CVD method used for the purposes of the present invention can be adapted and/or optimized, as needed.

In the simplest case of metallic materials, the measurement technology for detecting the required physical parameters can be a resistance measurement or a measurement of the electrical conductivity, respectively, at which a measuring chain can, on the one hand, consist of the inserted tool, comprising the doped and undoped diamond layer and, on the other hand, of the electrically conductive workpiece. As long as the undoped diamond layer is intact, the electrical conductivity will approach zero or the electrical resistance will be high, respectively. As soon as the undoped diamond layer has worn out due to wear and tribological stress, however, a significantly higher conductivity or a significantly lower resistance, respectively, will be measured.

After calibration of the system to a suitable threshold value, the exceeding or falling below of this threshold value can be monitored, e.g. for the electrical conductivity and/or the electrical resistance, and for example the drive device of the tool can be stopped or the movement of the tool can be slowed down initially by means of a separate electronic regulation or control circuit, which is known per se, or by means of a corresponding software-controlled regulation integrated in the drive device of the tool.

In addition to the measurement, which is described in an exemplary manner, of the electrical resistance and of the electrical conductivity, each physical measurement parameter can be used, which allows for a significant differentiation between doped and undoped diamonds. In particular in the case of tools, which are not electrically conductive and which are made of ceramic materials and/or materials, which are not electrically conductive, for instance carbon fiber-reinforced plastics, of which the workpiece to be machined consists, this can be a measurement of the capacitance, which also changes when the undoped diamond layer has worn to the extent that essentially only the doped diamond layer is still in contact with the workpiece.

Further physical variables and physical effects, which differ for doped and undoped diamonds, such as, for example, the Hall effect, can be utilized to provide for the continuous or periodic detection of the degree of wear of the undoped diamond layer. If necessary, suitable commercially available Hall probes can be used for this purpose.

The measurement parameters in question can be queried analogously or digitally as part of the present invention. The query can take place continuously or periodically, wherein a periodic query in a short interval, e.g. every 100 ms, in practice corresponds to a continuous detection. As needed, however, the query interval can also be adapted to the circumstances and the respective relevant parameter can for instance be measured periodically every 5 s.

For the purposes of the present invention, n-type doped as well as p-type doped diamond layers are preferably used as doped diamond layers.

Those foreign atoms, which are selected from the group consisting of: aluminum, boron, silicon, tungsten, iron, molybdenum, cobalt, niobium, tantalum, rhenium, nitrogen, and phosphor, as well as mixtures thereof, are preferred as foreign atoms for doping.

By the selection of the doping type (p-type, hole conduction, and n-type, electron conduction) and selection of the foreign atom and dopant concentration, the sensitivity of the measurement system as well as the physical, in particular electrical properties, of the formed semiconductor can be controlled as needed.

It is preferred to use boron for the p-type doping, because a CVD method, which can be controlled easily, is available in the prior art for the B-doping.

Provided that the use of n-type doped diamond is intended, nitrogen or phosphor are used as part of the present invention, because they can be introduced easily into a CVD vacuum chamber in the form of gaseous dopants, e.g. as $PH_3$ and/or $N_2$. In a preferred embodiment, the electrical resistance and/or the electrical conductivity and/or the capacitive resistance and/or the Hall voltage or the Hall current of a Hall sensor is detected as physical parameter. A number of devices is available in the prior art for the measurement of these parameters.

As part of the present invention, the physical parameter is detected between the tool and a machined workpiece, wherein preferably the electrical conductivity and/or the electrical resistance and/or the capacitance between machined workpiece and the tool is measured.

It is further preferred that the doped first diamond layer is applied to a cobalt-containing hard metal surface. It is ensured thereby that the diamond layer forms well, adhered tightly to the surface, and that the tool surface has a sufficient toughness and elasticity. If needed, however, the surface can also be pre-treated prior to the diamond coating, in order to further improve the adhesion of the diamond layer. This can take place, for example, by means of ion beams or by means of chemical treatment.

Due to the pretreatment of the substrate surface of a functional region of a tool, which also includes, for example hard material particles, e.g. WC grains, which are embedded in a cobalt-containing binding matrix, essentially no cobalt is removed from the binding matrix by means of ion beams, e.g. $N^+$, $N^{++}$ and/or $C^+$, but the irradiated ions are incorporated into the structure of the binding matrix.

Without being bound thereto, cobalt could convert, for example, by means of the irradiated light ions into cobalt nitrides or cobalt carbon nitrides, respectively, or also into cobalt carbides, which do not display the known catalytic effect for the reconversion of the cubic diamond phase into the hexagonal graphitic phase, so that the cubic diamond crystals have sufficient time to grow on the substrate surface, without resulting in an in situ reconversion in the graphite.

As part of the present invention, it is generally preferred that the doped and the undoped diamond layer are applied to the metal surface by means of chemical vapor deposition (CVD) from a methane/hydrogen atmosphere, wherein preferably hydrogen is added to the methane in molar excess. Such a coating method, which is embodied as HF-CVD method, can be carried out relatively easily, quickly, and cost-efficiently. The doping of the first diamond layer can further be created by supply of a doping gas, in particular $B_2H_6$, during the CVD method in a CVD chamber. The undoped second diamond layer can thereby be created easily by interruption of the supply of the doping gas into the CVD chamber, so that no further operating steps are required for producing the doped and the undoped diamond layer.

It goes without saying, however, that for example a first (still undoped) polycrystalline diamond layer can also be produced, if necessary, by means of CVD as part of the present invention, and that the obtained layer is irradiated with an ion beam of the desired foreign atom for doping the first diamond layer. A tempering step or a so-called "annealing step" typically takes place following the ion beam treatment, in order to "anneal" lattice defects occurring in response to the irradiation. The undoped second diamond layer can then be deposited on the first diamond layer, which is now doped.

As part of the present invention, the first doped and the second undoped diamond layer is applied to the metal surface by means of chemical vapor deposition (CVD) from a methane/hydrogen atmosphere in a CVD chamber, wherein hydrogen is preferably added to the methane in molar excess. The method according to the invention is further carried out at a coating temperature of between 800° C. and 1100° C. and a coating pressure of between 1 kPa and 100 hPa.

If needed, the substrate surface can be pre-germinated, for example, by dusting with diamond powder prior to the application of the first doped diamond layer.

The CVD method according to the invention is preferably carried out as HF-CVD method, in the case of which a W-wire is used as heating wire.

In practice, it thereby turned out that satisfactory results with regard to the demands on the tribological stressability of the diamond layers and the sufficient differences in the electrical properties of the doped and of the undoped diamond layer can be attained by means of the above-described method, and that the doping of the p-type by means of boron is particularly simple, because only a boron-containing gas, preferably $B_2H_6$, is supplied as doping gas for the doping of the first diamond layer, and the supply of the doping gas can simply be interrupted for switching over to the creation of the undoped diamond layer.

The tools produced according to the invention can be monolithically or modularly constructed tools.

As mentioned above, the tools of the present invention can contain hard material particles. They are preferably selected from the group consisting of: the carbides, carbonitrides and nitrides of the metals of group IV, group V, and group VI of the Periodic Table of the Elements, and boron nitride, in particular cubic boron nitride; as well as oxidic hard materials, in particular aluminum oxide and chromium oxide; as well as in particular titanium carbide, titanium nitride, titanium carbonitride; vanadium carbide, niobium carbide, tantalum carbide; chromium carbide, molybdenum carbide, tungsten carbide; as well as mixtures and mixed phases thereof.

FIG. 1 schematically depicts a section of an embodiment of a machining tool 10 in accordance with the present invention. Referring to FIG. 1, the machining tool 10 comprises a metallic substrate 11, a doped polycrystalline diamond layer 12 and an un-doped polycrystalline layer 13.

Further advantages and features of the present invention follow based on the description of concrete exemplary embodiments.

EXAMPLE 1

Production of Tools with Doped and Undoped Diamond Layers

After cleaning and degreasing the surface with acetone or a different organic solvent, hard metal spiral drills of a 10M % Co hard metal comprising an average WC grain size of 0.6 μm (Gühring trade name DK460UF) and after particle blasting, the tools to be coated with quartz particles were subjected to an acidic etching step for removing Co from the surface. According to WO 2004/031437 A1, a mixture of $HCl/HNO_3$ was used for this purpose. After rinsing and drying, the tools, which were pretreated in this way, were introduced into the vacuum chamber of a commercially available hot wire CVD system (CemeCon CC800/5). The tungsten wires (99.99% purity) of the CVD system are arranged parallel to one another at a distance of approx. 4 mm. The drills were circumferentially surrounded by the filaments parallel to their longitudinal axis. The temperature of the filaments was set to approx. 2100° C. The temperature was measured by means of optical thermometers. The distance of the filaments to the tool to be coated was 5 mm.

First of all, a doped diamond layer was produced on the surface of the tools by supplying $H_2/CH_4$ as material gas and $B_2H_6$ as doping gas. In the exemplary case, the following mass flows were used thereby after preliminary tests:

$H_2$ 600 sccm
$CH_4$ 5 sccm
$B_2H_6$ 2 sccm

"sccm" hereby stands for standard cubic centimeters per minute. Regardless of pressure and temperature, a defined streaming gas quantity per time unit is thus described with this unit, a mass stream is thus specified.

The standard cubic centimeter is thereby a gas volume of $V=1$ cm$^3$ under standard conditions (T=0° C. and p=1013,25 hPA), the so-called physical standard conditions according to DIN 1343.

The specified mass streams were applied for 80 hours. The supply of the dopant diborane was then blocked and the mass streams for $H_2$ and $CH_4$ were maintained for further 180 hours. The temperature of the tools to be coated was 970° C., the pressure in the CVD chamber was approx. 13 kPa.

A layer thickness measurement (REM with focused ion beam [FIB], Helios NanoLab 600 by FEI) of the doped diamond layer resulted in values of between 70 and 90 µm. The total layer thickness in the present exemplary case was approximately 220 µm, which results in a layer thickness of approximately 130 µm for the undoped diamond layer.

The concentration of boron was determined by the Curcumin method. The boron-containing diamond material with oxygen is thereby removed from the metal surface according to DE 101 17 867 A1 by heating to 700° C. The diamond carbon thereby burns to $CO_2$, and boron is oxidized into boron trioxide and borates, which are infused with curcumin in the acidic range, which, with borates, forms a red complex of Rosocyanine, which is analyzed photometrically at 540 nm and is compared to standard borate solutions. In the doped diamond layer according to this method, the boron content was between 7 and 10 atomic percent, based on C+B in the doped diamond layer.

The electrical properties of the doped and of the undoped diamond layers were initially measured as part of the present invention.

After measurement of the absolute layer resistance of the boron-doped layer (four-point method according to Vogel 2005), the specific resistance of the obtained boron-doped diamond layers (p-type doping) was determined by multiplication with the layer thickness and, at room temperature and a degree of doping of 10 atomic percent, based on C+B in the doped diamond layer, is 1.58 Ωcm, whereas the specific resistance of a pure undoped diamond layer (produced on the tool as described above, but without doping gas supply) is $5.6 \times 10^{13}$ Ωcm. It is thus shown that the conductivity of diamond can be changed by many orders of magnitude by doping in general—in the exemplary case with boron—which can be used metrologically for the purposes of the present invention to detect the degree of wear of an undoped polycrystalline diamond layer.

EXAMPLE 2

Measurement Principles and Drilling Tests

The drilling tools obtained according to Example 1 were tested in highly abrasive test workpieces of AlSi9 and AlSi17. These materials are electrically conductive.

Cuboid blocks with a surface area of 5×5 cm and a height of 10 cm as workpiece test specimen were made of these materials. The specimen were clamped into the workpiece accommodation of an industrial drilling device by GÜHRING KG, Albstadt. A 10 mm drill, to which, according to Example 1, a doped diamond layer and a diamond layer, which is undoped on the chip side, was applied, was clamped into the tool accommodation of the drilling device. The total layer thickness was approx. 220 µm. The drilling device was programmed in such a way that a 9 cm deep hole was drilled per specimen, and one then moved on to the next workpiece. For the purposes of the present tests, no coolants or lubricants were used.

The drilling tests were designed as follows:
Process: drilling into solid material, drilling depth 900 mm
Cutting speed: 100 m/min A measurement arrangement for the conductivity measurement of the overall system drill holder—drilling tool—doped diamond layer—undoped diamond layer—test workpiece was created. The measurement took place in the usual manner of the conductivity measurement of non-ferrous metals without contact (eddy current method according to DIN EN 2004-1) with a commercially available device (SIGMASCOPE® SMP350 by HELMUT FISCHER GmbH, Sindelfingen) and corresponding probes having a frequency of 15 kHz, in the case of which the measurement data was read into a computer via a USB interface, was compared to a threshold value, and a switch for turning off the drive device of the drill to be tested was operated by the software when the threshold value was exceeded. The measuring probes of the conductivity measuring device were arranged on the workpiece and on the tool holder, so that the conductivity of the above-defined overall system was detected. In the beginning, a conductivity of the overall system of virtually 0 MS/m was found.

A conductivity of between approx. 12 and 17 MS/m was determined for this system in preliminary tests when testing drills, which were only provided with a B-doped diamond layer, but did not have an undoped diamond layer. A threshold value of 15 MS/m was formed therefrom. Should this threshold value be exceeded in the case of the test system according to the invention, this means that the undoped diamond layer, which forms the actual functional region of the tool, has worn and that the drill already runs in the "emergency mode" on the doped diamond layer, but nonetheless fulfills its function. As soon as a value of 15 MS/m is exceeded in the test, the computer outputs a signal for turning off the drill, by means of which it is prevented that the drill, the workpiece or the drive machine are damaged and that the drill can be exchanged at the right time.

It has been shown in the practical tests that the drills used according to the invention fulfill all expectations on the wear resistance, service lives and reaches of a conventional diamond tool.

It has further been shown that even though the change of the conductivity occurs gradually, it reaches its maximum within a few minutes at the predetermined cutting speed. It can thus be seen that not only the absolute value can serve as measurement parameter, but that for example the speed of the change or also the edge steepness of the change of a measurement parameter can also be used to accomplish the detection according to the invention of the degree of wear of an undoped diamond layer.

The doped diamond layer thus quasi serves as "intelligent stop layer" for diamond-coated tools.

EXAMPLE 3

Ion Beam Pretreatment

Hard metal spiral drills of a 10M % Co hard metal comprising an average WC grain size of 0.6 µm (Gühring trade name DK460UF) were coated as described in Example 1, but no chemical pretreatment of the substrate surface took place, but it was irradiated with an ion stream of nitrogen ions for 3.5 hours, wherein the ion stream was created with a voltage of 30 kV at 3 mA plasma stream at a nitrogen pressure of 1×10⁻⁵ mbar. A commercially available ion generator was used (on generator "Hardion" by Quertech, Caen) to create the ion beam.

A temperature of approx. 400° C. was thereby reached on the tool. The tool was then provided with a doped and an undoped diamond layer in a commercially available hot wire CVD system (CemeCon CC800/5), as in Example 1, and the conductivity measurement was carried out as described in Example 2.

As expected, lower absolute conductivity values of the overall system were reached, because the doped layer was deposited on a more strongly insulating substrate layer.

The conductivity data, however, could also be used in the case of these diamond-coated tools, which were improved with regard to their service lives, to detect the degree of wear of the undoped diamond layer and to turn off the drilling device at the right time or to reduce the cutting speed.

The invention claimed is:

1. A machining tool comprising:
   a metallic substrate layer having a cobalt-containing hard metal surface;
   a first diamond layer, which is doped with foreign atoms and which is made of polycrystalline diamonds and which is arranged on the metallic substrate layer; and
   an undoped polycrystalline second diamond layer, which is arranged on the first diamond layer and which forms a functional region of the machining tool, whereby detecting change in at least one physical parameter during operation of the tool indicates wear of the undoped second diamond layer.

2. The machining tool according to claim 1, wherein the first diamond layer is an n-type doped or a p-type doped diamond layer.

3. The machining tool according to claim 1, wherein the foreign atoms are selected from the group consisting of: aluminum, boron, silicon, tungsten, iron, molybdenum, cobalt, niobium, tantalum, rhenium, nitrogen, and phosphor, as well as mixtures thereof.

4. The machining tool according to claim 1, wherein at least some of the foreign atoms are boron atoms.

5. The machining tool according to claim 1, wherein at least some of the foreign atoms are nitrogen atoms or phosphor atoms.

6. The machining tool according to claim 1, wherein the at least one physical parameter is/are selected from the group consisting of the electrical resistance, the electrical conductivity, the capacitive resistance, the Hall voltage and the Hall current of a Hall sensor.

7. The machining tool according to claim 1, wherein the physical parameter is detected between the tool and a machined workpiece.

8. The machining tool according to claim 7, wherein the at least one physical parameter is/are selected from the electrical conductivity, the electrical resistance, and the capacitance between machined workpiece and the tool.

9. The machining tool according to claim 1, wherein the doped and the undoped diamond layer are applied to the metal surface by chemical vapor deposition (CVD) from a methane/hydrogen atmosphere.

10. The machining tool according to claim 1, wherein the doping of the first diamond layer is created by supply of a doping gas, during a CVD method in a CVD chamber.

11. The machining tool according to claim 1, wherein the undoped second diamond layer is created by interruption of the supply of the doping gas into the CVD chamber.

12. The machining tool according to claim 1, wherein the first polycrystalline diamond layer is produced by CVD, and the obtained layer is irradiated with an ion beam of the desired foreign atom for doping the first diamond layer; and then a tempering step is carried out; and the undoped second diamond layer is then deposited on the doped first diamond layer.

13. A machining tool as recited in claim 1, wherein the cobalt-containing hard metal surface has been subjected to at least one of an ion beam treatment and a chemical treatment to improve adhesion of the first diamond layer to the metallic substrate layer.

14. A machining tool as recited in claim 1, wherein the cobalt-containing hard metal surface has been subjected to acidic etching to remove some cobalt from the cobalt-containing hard metal surface.

15. A machining tool as recited in claim 1, wherein the machining tool further comprises at least one Hall effect probe.

16. A method for detecting wear of an undoped diamond layer, which is arranged on a first doped diamond layer which is arranged on a metallic substrate layer, in which the undoped diamond layer forms a functional region of a machining tool, and is arranged on a diamond layer doped with foreign atoms, during operation of the tool, the method comprising:
   a) detecting at least one measurement parameter, which results from the undoped and doped diamond layers, the tool, and a workpiece machined with the tool, continuously or periodically during operation of the tool; and
   b) determining whether the measurement parameter passes a predefined threshold value that indicates a degree of wear of the undoped diamond layer.

17. The method according to claim 16, wherein the measurement parameter is the Hall effect.

18. The method according to claim 16, wherein the foreign atoms are selected from the group consisting of: aluminum, boron, silicon, tungsten, iron, molybdenum, cobalt, niobium, tantalum, rhenium, nitrogen, and phosphor, as well as mixtures thereof.

19. The method according to claim 16, wherein the foreign atoms comprise at least one of boron, nitrogen and phosphorus.

20. The method according to claim 16, wherein the doped diamond layer is applied to a cobalt-containing hard metal surface.

21. The method according to claim 16, wherein the doped diamond layer and the undoped diamond layer are applied to a metal surface by chemical vapor deposition (CVD) from a methane/hydrogen atmosphere in a CVD chamber, wherein a coating temperature of between 800° C. and 1100° C. and a coating pressure of between 1 kPa and 100 hPa is set.

22. The method according to claim 16, wherein the doping of the doped diamond layer is created by supply of a doping gas during chemical vapor deposition in a CVD chamber.

23. The method according to claim 16, wherein the undoped diamond layer is created by interruption of supply of a doping gas into a CVD chamber.

24. A method as recited in claim 16, wherein the method further comprises reducing a cutting speed of the machining tool upon determining that the measurement parameter passes the predefined threshold value.

25. A method as recited in claim 16, wherein the method further comprises re-coating the machining tool with an undoped diamond layer after determining that the measurement parameter has passed the predefined threshold value.

26. A method as recited in claim 16, wherein the method further comprises irradiating an undoped polycrystalline diamond layer with an ion beam to form the doped diamond layer.

27. A method as recited in claim 16, wherein the method further comprises pre-germinating a surface of the metallic substrate layer by dusting the metallic substrate layer with diamond powder.

28. A method as recited in claim 16, wherein the method further comprises irradiating a surface of the metallic substrate layer with an ion stream of nitrogen ions.

29. A method for continuously detecting the degree of wear of an undoped diamond layer, which forms a functional region of a machining tool, and which is arranged on a diamond layer doped with foreign atoms, during operation of the tool; wherein
   a) the doped diamond layer is arranged directly on the substrate surface of the machining tool;
   b) at least one measurement parameter, which results from both diamond layers, the tool, and a workpiece machined with the tool, is detected continuously or periodically during the operation of the tool;
   c) predefined threshold value for the measurement parameter is specified; and wherein
   d) a change of the measurement parameter above or below the predefined threshold value indicates the degree of wear of the undoped diamond layer, wherein:
      the doped diamond layer and the undoped diamond layer are applied to a metal surface by chemical vapor deposition (CVD) from a methane/hydrogen atmosphere in a CVD chamber, wherein a coating temperature of between 800° C. and 1100° C. and a coating pressure of between 1 kPa and 100 hPa is set, and
      a W-wire is used as a heating wire in a hot wire method in carrying out said chemical vapor deposition.

* * * * *